(12) United States Patent
Hong et al.

(10) Patent No.: US 11,664,433 B2
(45) Date of Patent: May 30, 2023

(54) INTEGRATED CIRCUIT DEVICES INCLUDING STACKED TRANSISTORS

(71) Applicant: Samsung Electronics Co., Ltd., Suwon-si (KR)

(72) Inventors: Byounghak Hong, Albany, NY (US); Seunghyun Song, Albany, NY (US); Inchan Hwang, Schenectady, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/366,534

(22) Filed: Jul. 2, 2021

(65) Prior Publication Data
US 2022/0344481 A1    Oct. 27, 2022

Related U.S. Application Data

(60) Provisional application No. 63/177,413, filed on Apr. 21, 2021.

(51) Int. Cl.
| | | |
|---|---|---|
| H01L 29/417 | (2006.01) | |
| H01L 27/088 | (2006.01) | |
| H01L 21/8234 | (2006.01) | |
| H01L 29/423 | (2006.01) | |
| H01L 29/40 | (2006.01) | |
| H01L 29/08 | (2006.01) | |
| H01L 29/06 | (2006.01) | |

(52) U.S. Cl.
CPC ............... *H01L 29/41775* (2013.01); *H01L 21/823425* (2013.01); *H01L 21/823475* (2013.01); *H01L 27/088* (2013.01); *H01L 29/0847* (2013.01); *H01L 29/401* (2013.01); *H01L 29/41733* (2013.01); *H01L 29/42392* (2013.01); *H01L 29/0665* (2013.01)

(58) Field of Classification Search
CPC .......... H01L 27/0921; H01L 29/42392; H01L 29/78696; H01L 29/41791; H01L 29/7853
See application file for complete search history.

(56) References Cited

U.S. PATENT DOCUMENTS

| | | | |
|---|---|---|---|
| 10,164,121 B2 | 12/2018 | Hatcher et al. | |
| 10,192,867 B1 | 1/2019 | Frougier et al. | |
| 10,236,217 B1 * | 3/2019 | Ando | H01L 29/78654 |
| 10,373,942 B2 | 8/2019 | Asra et al. | |
| 10,483,166 B1 | 11/2019 | Cheng et al. | |
| 10,833,081 B2 | 11/2020 | Zhang et al. | |
| 10,879,352 B2 | 12/2020 | Zhang et al. | |
| 2018/0315838 A1 | 11/2018 | Morrow et al. | |
| 2021/0035975 A1 | 2/2021 | Kim et al. | |
| 2021/0074730 A1 | 3/2021 | Stamper et al. | |

* cited by examiner

*Primary Examiner* — Changhyun Yi
(74) *Attorney, Agent, or Firm* — Myers Bigel, P.A.

(57) ABSTRACT

Integrated circuit devices may include a lower transistor and an upper transistor stacked on a substrate and may include a conductive contact. The upper transistor may include an upper source/drain region that overlaps a lower source/drain region of the lower transistor. The conductive contact may contact a side surface of the upper source/drain region and may overlap a center portion of the lower source/drain region. The side surface of the upper source/drain region may include a protrusion and a recess.

19 Claims, 12 Drawing Sheets

INTEGRATED CIRCUIT DEVICES INCLUDING STACKED TRANSISTORS

CROSS-REFERENCE TO RELATED APPLICATION

This application claims priority to U.S. Provisional Application Ser. No. 63/177,413, entitled EFFICIENT CONTACT FORMATION TECHNOLOGY FOR 3D STACKED STRUCTURE, filed in the USPTO on Apr. 21, 2021, the disclosure of which is hereby incorporated by reference herein in its entirety.

FIELD

The present disclosure generally relates to the field of electronics and, more particularly, to integrated circuit devices including stacked transistors.

BACKGROUND

An integrated circuit device including stacked transistors, such as a complementary field effect transistor (CFET) stack, was introduced to reduce its area to close to one-half of the area of a corresponding non-stacked device. However, an integrated circuit device including stacked transistors may include additional elements for electrical connection between the stacked transistors, and thus the reduction of its area may be limited.

SUMMARY

According to some embodiments of the present inventive concept, integrated circuit devices may include an upper transistor on a substrate and a lower transistor between the substrate and the upper transistor. The upper transistor may include an upper active region and first and second upper source/drain regions that are spaced apart from each other in a first horizontal direction and contact opposing side surfaces of the upper active region, respectively. The first horizontal direction may be parallel to an upper surface of the substrate. The lower transistor may include a lower active region and first and second lower source/drain regions that are spaced apart from each other in the first horizontal direction and contact opposing side surfaces of the lower active region, respectively. The first upper source/drain region may overlap the first lower source/drain region in a vertical direction that may be perpendicular to the upper surface of the substrate, and the first lower source/drain region may include a center portion in a second horizontal direction that may be perpendicular to the first horizontal direction and may be parallel to the upper surface of the substrate. The integrated circuit devices may also include a conductive contact that may contact a side surface of the first upper source/drain region and may overlap the center portion of the first lower source/drain region in the vertical direction.

According to some embodiments of the present inventive concept, integrated circuit devices may include first and second upper transistors on a substrate and first and second lower transistors between the substrate and the first and second upper transistors. The first and second upper transistors may be spaced apart from each other in a first horizontal direction that may be parallel to an upper surface of the substrate, each of the first and second upper transistors may include an upper active region and an upper source/drain region that includes a first surface contacting the upper active region and a second surface opposite the first surface, and the second surfaces of the upper source/drain regions may be spaced apart from each other in the first horizontal direction. Each of the first and second lower transistors may include a lower active region and a lower source/drain region contacting the lower active region. The integrated circuit devices may also include a conductive contact that may contact the second surfaces of the upper source/drain regions.

According to some embodiments of the present inventive concept, methods of forming an integrated circuit device may include forming first and second lower transistors on a substrate, each of the first and second lower transistors including a lower active region and a lower source/drain region contacting the lower active region; forming first and second upper transistors on the first and second lower transistors, wherein the first and second upper transistors may be spaced apart from each other in a first horizontal direction that may be parallel to an upper surface of the substrate, each of the first and second upper transistors may include an upper active region and an upper source/drain region that may include a first surface contacting the upper active region and a second surface opposite the first surface, and the second surfaces of the upper source/drain regions may be spaced apart from each other in the first horizontal direction; forming an insulating layer on the first and second upper transistors, the insulating layer separating the second surfaces of the upper source/drain regions from each other; forming an opening in the insulating layer, the opening exposing the second surfaces of the upper source/drain regions; and forming a conductive contact in the opening.

DETAILED DESCRIPTION

According to some embodiments of the present inventive concept, an integrated circuit device including transistors stacked in a vertical direction may include a conductive contact that electrically connects a source/drain region of an upper transistor to element(s) (e.g., a metal line) formed during back end of line (BEOL) processes. The conductive contact may be formed to overlap a source/drain region of a lower transistor such that the conductive contact may be provided without increasing device area. In some embodiments, the source/drain region of the upper transistor may be formed to have a smaller volume than the source/drain region of the lower transistor, and thus a parasitic capacitance between the source/drain region of the upper transistor and other conductive elements may decrease. An integrated circuit device including transistors stacked in a vertical direction is also referred to as a stacked integrated circuit device herein.

According to some embodiments, a stacked integrated circuit device may include two upper transistors, each of which includes an upper source/drain region, and a conductive contact that electrically connects the upper source/drain regions to elements formed during the BEOL processes. The upper source/drain regions may be spaced apart from each other thereby defining a space therebetween, and the conductive contact may be formed by filling that space. Compared to processes in which portions of the upper source/drain regions are removed by an etch process to form an opening, and then a conductive contact is formed in the opening, methods according to some embodiments of the present inventive concept may reduce damage to the upper source/drain regions by an etch process. Further, an interface between the conductive contact and the upper source/drain regions may not be straight thereby increasing an interface area therebetween. The increased interface area may reduce electrical resistance between the conductive contact and the upper source/drain regions.

According to some embodiments of the present inventive concept, a stacked integrated circuit device may be an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, or a D flip-flop.

An inverter will be described as an example of a stacked integrated circuit device with reference to FIGS. 1, 2A, 2B, 3, 4 and 5. The present inventive concept, however, can be applied to various stacked integrated circuit devices.

Figure 1:
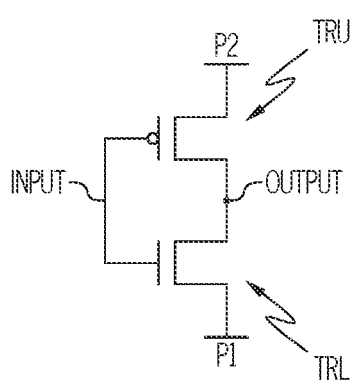
FIG. 1 is a circuit diagram of an inverter according to some embodiments of the present inventive concept.
Figure 2A:
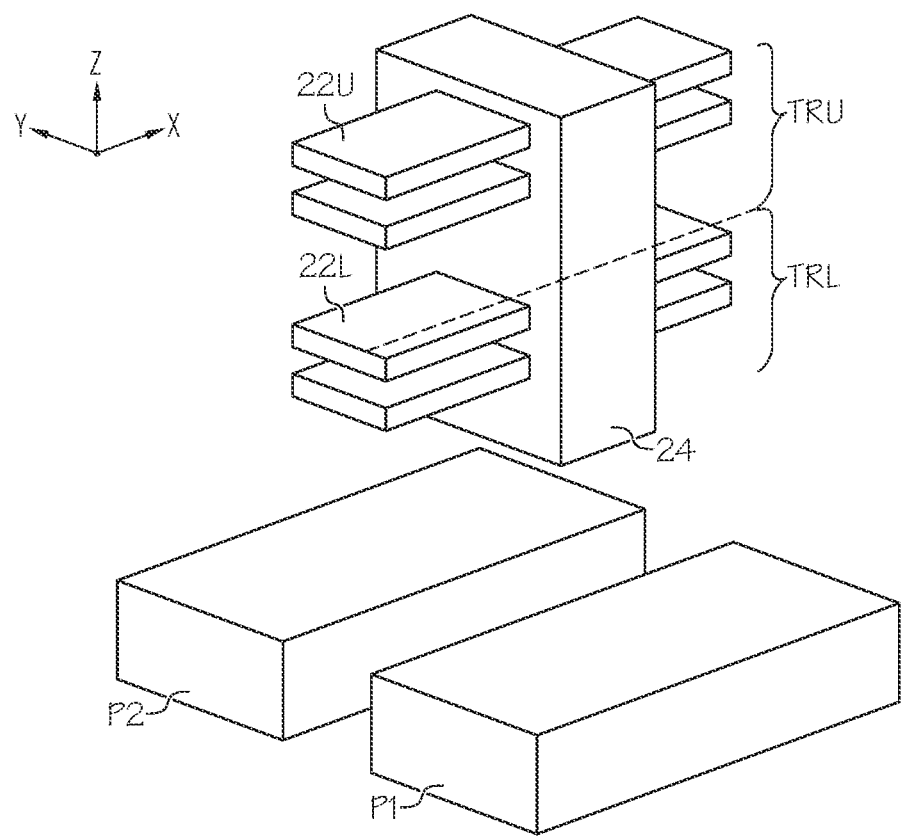
FIGS. 2A and 2B are perspective views of the inverter of FIG. 1 according to some embodiments of the present inventive concept.
Figure 2B:
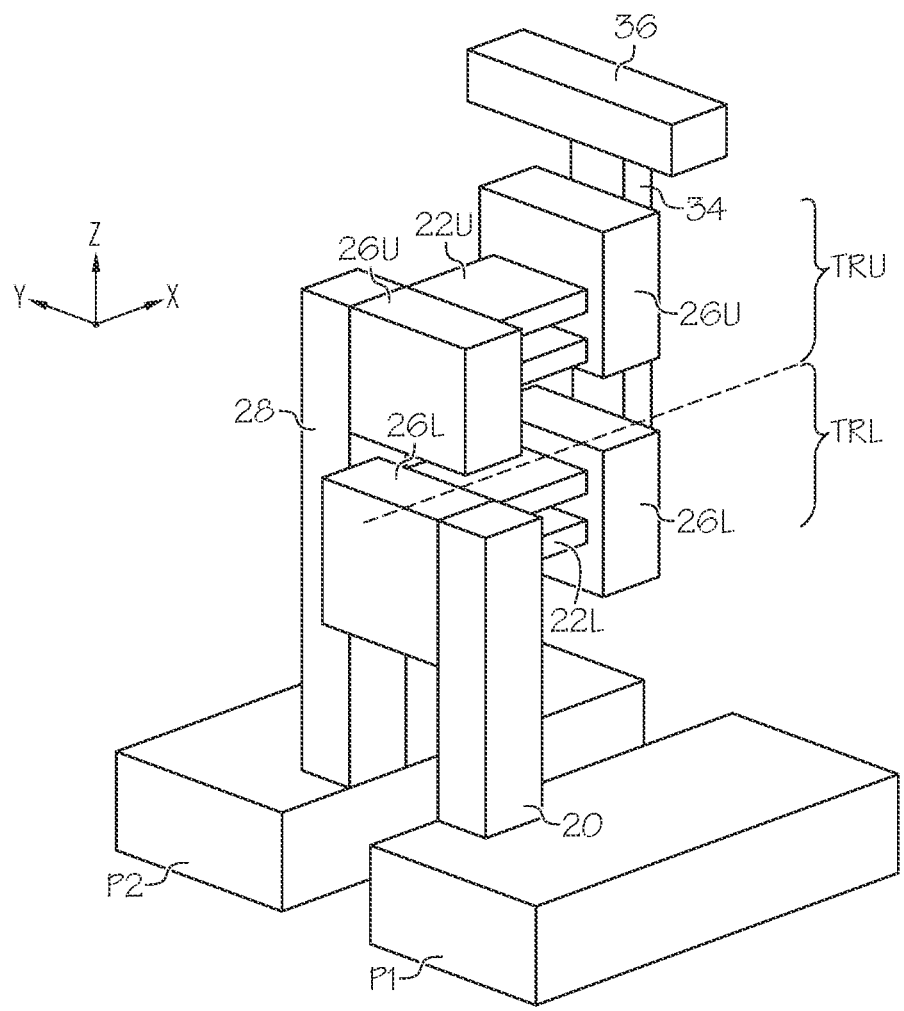

FIG. 1 is a circuit diagram of an inverter according to some embodiments of the present inventive concept, and FIGS. 2A and 2B are perspective views of the inverter of FIG. 1 according to some embodiments of the present inventive concept. Groups of elements of the single inverter are shown respectively in FIGS. 2A and 2B for simplicity of illustration, and thus each of FIGS. 2A and 2B shows some elements (but not all elements) of the single inverter. FIGS. 2A and 2B are provided to illustrate spatial relationships and electrical connections between elements, and the present inventive concept is not limited to the shapes and dimensions of those elements illustrated in FIGS. 2A and 2B.

Referring to FIGS. 1, 2A, and 2B, an inverter may include a lower transistor TRL (e.g., an N-type transistor or a P-type transistor) and an upper transistor TRU (e.g., a P-type transistor or an N-type transistor). The lower transistor TRL and the upper transistor TRU may be configured to receive a common input Input and may be configured to output a common output Output. Although not illustrated in FIGS. 2A and 2B, various insulating layers (e.g., a first insulating layer 42 and a second insulating layer 44 in FIG. 4) may be provided between elements for electrical isolation.

The lower transistor TRL may be connected to a first power line P1, and the upper transistor TRU may be connected to a second power line P2. The first power line P1 may be connected to a first power having a first voltage (e.g., a source voltage). For example, the first voltage may be an electrical ground voltage. The second power line P2 may be connected to a second power having a second voltage (e.g., a drain voltage). As used herein "an element A connected to an element B" (or similar language) means that the element A is physically and/or electrically connected to the element B.

In some embodiments, each of the first power line P1 and the second power line P2 may extend in a first horizontal direction (e.g., a X direction) and may be spaced apart from each other in a second horizontal direction (e.g., a Y direction). Both the first horizontal direction and the second horizontal direction may be parallel to an upper surface of a substrate (e.g., an upper surface 100U of a substrate 100 in FIG. 4). The first horizontal direction may traverse the second horizontal direction. In some embodiments, the first horizontal direction may be perpendicular to the second horizontal direction. As used herein, "an element A extends in a direction B" (or similar language) means that the element A extends longitudinally in the direction B.

The lower transistor TRL may include lower active regions 22L and lower source/drain regions 26L respectively contacting opposing ends of the lower active regions 22L. In some embodiments, the lower active regions 22L may extend in the first horizontal direction, and the lower source/drain regions 26L may be spaced apart from each other in the first horizontal direction. One of the lower source/drain regions 26L may be electrically connected to the first power line P1 through a first power via 20. "Active region" as used herein refers to a region in which a channel of a transistor is formed when the transistor is turned on. Accordingly, "active region" may be interchangeable with "channel region."

The upper transistor TRU may include upper active regions 22U and upper source/drain regions 26U respectively contacting opposing ends of the upper active regions 22U. In some embodiments, the upper active regions 22U may extend in the first horizontal direction X, and the upper source/drain regions 26U may be spaced apart from each other in the first horizontal direction. One of the upper source/drain regions 26U may be electrically connected to the second power line P2 through a second power via 28.

In some embodiments, the lower active regions 22L and the upper active regions 22U may include multiple layers stacked in a vertical direction (e.g., a Z direction) that may be perpendicular to both the first horizontal direction and the second horizontal direction. Although FIG. 2A illustrates that the lower active regions 22L include two stacked layers, and the upper active regions 22U include two stacked layers, the lower active regions 22L and the upper active regions 22U may include various numbers of layers.

The inverter may also include a gate structure 24 on the lower active regions 22L and the upper active regions 22U. In some embodiments, the gate structure 24 may contact both the lower active regions 22L and the upper active regions 22U and may be shared by the lower transistor TRL and the upper transistor TRU. The gate structure 24 may include a lower portion that is between the lower source/drain regions 26L, and the lower portion of the gate structure 24 may be a lower gate structure (e.g., a lower gate structure 24L in FIG. 4). The gate structure 24 may include an upper portion that is between the upper source/drain regions 26U, and the upper portion of the gate structure 24 may be an upper gate structure (e.g., an upper gate structure 24U in FIG. 4).

Although FIG. 2A illustrates the gate structure 24 as a single layer, the gate structure 24 may include multiple layers that include, for example, a gate insulator (e.g., gate insulators 24L_1 or 24U_1 in FIG. 5) and a gate electrode (e.g., gate electrodes 24L_3 and 24U_3 in FIG. 5) sequentially stacked on the lower active regions 22L or the upper active regions 22U.

One of the lower source/drain regions 26L and one of the upper source/drain regions 26U may be electrically connected to each other through a conductive contact 34. In some embodiments, the conductive contact 34 may contact both the lower source/drain region 26L and the upper source/drain region 26U as illustrated in FIG. 2B. The conductive contact 34 may electrically connect the lower source/drain region 26L and the upper source/drain region 26U to a metal line 36, that may be formed during BEOL processes. Although FIG. 2B illustrates that the conductive contact 34 contacts the metal line 36, in some embodiments, via contact(s) may be provided between the conductive contact 34 and the metal line 36 for electrical connection therebetween.

Figure 3:
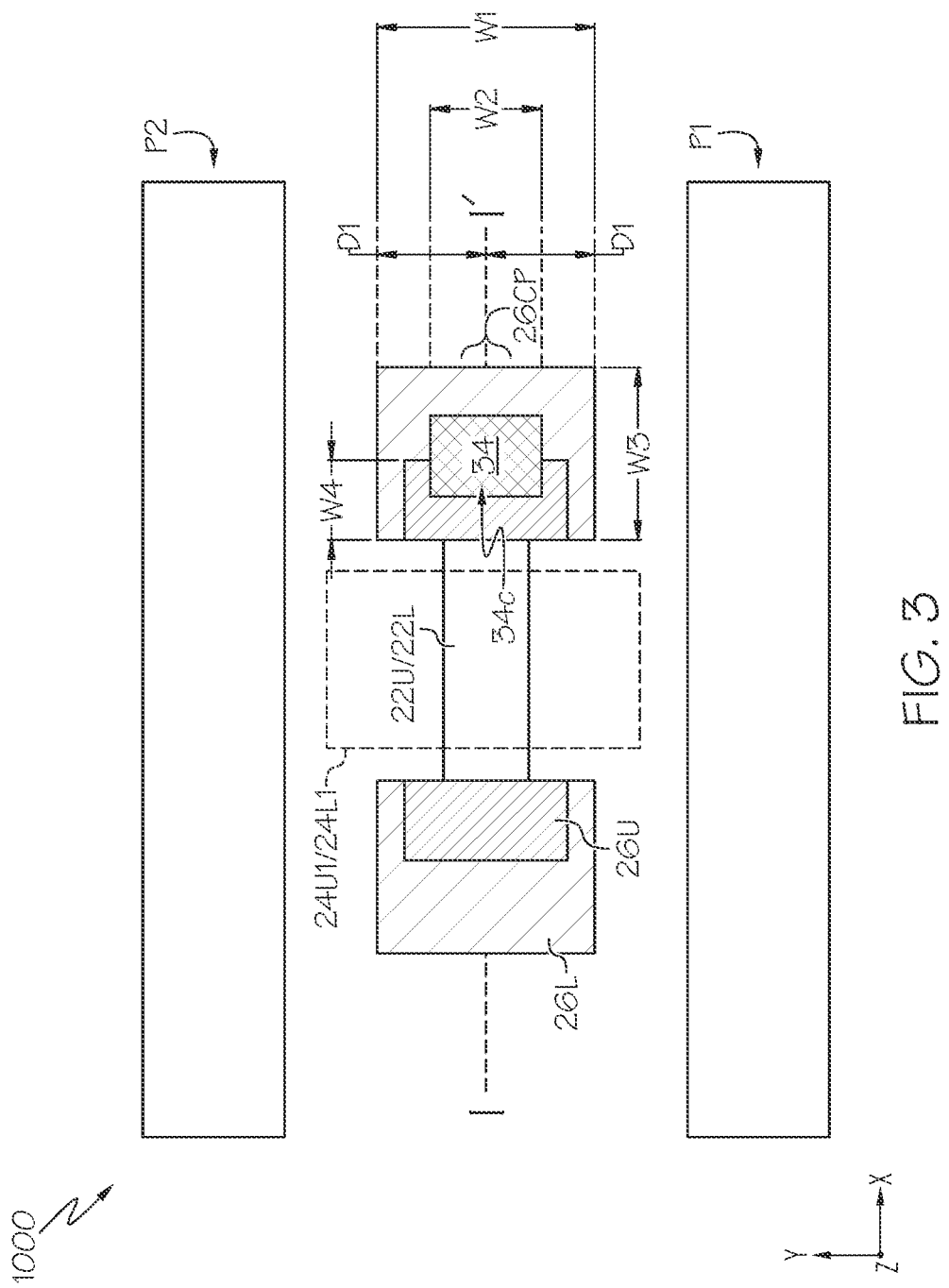
FIG. 3 is a schematic layout of a stacked integrated circuit device according to some embodiments of the present inventive concept.
Figure 4:
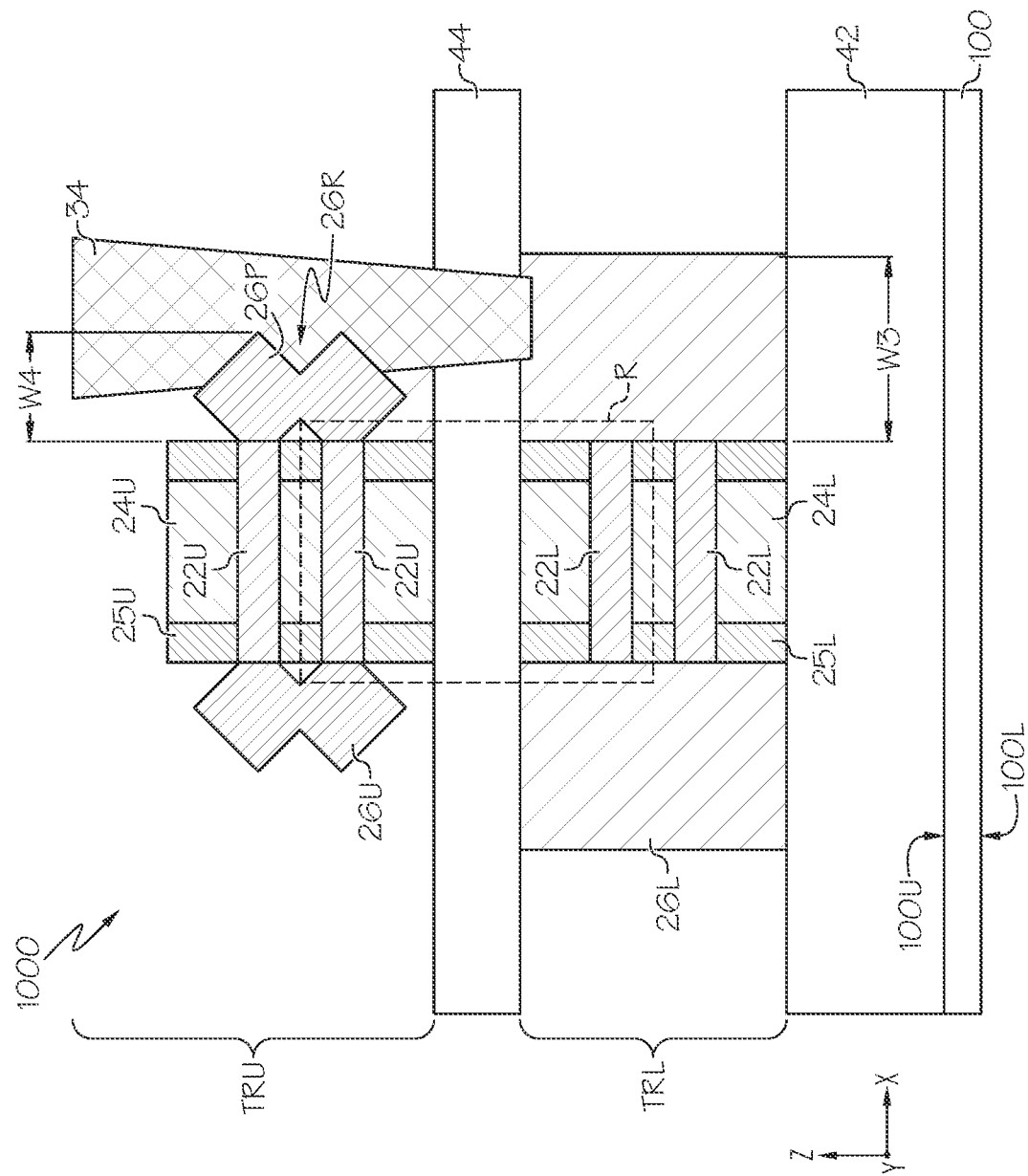
FIG. 4 is a cross-sectional view taken along the line I-I' in FIG. 3.

FIG. 3 is a schematic layout of a stacked integrated circuit device 1000 according to some embodiments of the present inventive concept, and FIG. 4 is a cross-sectional view taken along the line I-I' in FIG. 3. For simplicity of illustration, several elements in FIGS. 2A and 2B (e.g., the first power via 20, the second power via 28, and the metal line 36) are omitted from FIGS. 3 and 4.

Referring to FIGS. 3 and 4, the stacked integrated circuit device 1000 may include a lower transistor TRL and an upper transistor TRU sequentially stacked on a substrate 100. A first insulating layer 42 may be formed between the lower transistor TRL and the substrate 100.

The substrate 100 may include a semiconductor material (e.g., silicon, germanium, silicon-germanium) and/or III-V semiconductor compounds (e.g., GaP, GaAs, GaSb). In some embodiments, the substrate 100 may be a semiconductor-on-insulator substrate (e.g., such as a silicon-on-insulator (SOI) substrate or a germanium-on-insulator (GOI) substrate). As used herein the term "and/or" includes any and all combinations of one or more of the associated listed items.

The lower transistor TRL may include lower channel regions 22L stacked on the first insulating layer 42 in a vertical direction (e.g., a Z direction). The vertical direction may be perpendicular to an upper surface 100U of the substrate 100. The upper surface 100U of the substrate 100 may face the lower transistor TRL, and the substrate 100 may also include a lower surface 100L opposite the upper surface 100U. The upper surface 100U and the lower surface 100L may be parallel to each other. In some embodiments, the lower channel region 22L may extend longitudinally in a first horizontal direction (e.g., a X direction) that may be parallel to the upper surface 100U of the substrate 100.

The lower transistor TRL may also include lower source/drain regions 26L spaced apart from each other in the first horizontal direction. The lower source/drain regions 26L may respectively contact opposing side surfaces of the lower channel regions 22L. Further, the lower transistor TRL may include a lower gate structure 24L and a lower spacer 25L. The lower spacer 25L may separate the lower gate structure 24L from the lower source/drain regions 26L such that the lower gate structure 24L may be electrically isolated from the lower source/drain regions 26L.

The upper transistor TRU may include upper channel regions 22U stacked in the vertical direction on the lower transistor TRL. The upper transistor TRU may also include upper source/drain regions 26U spaced apart from each other in the first horizontal direction. The upper source/drain regions 26U may respectively contact opposing side surfaces of the lower channel regions 22L. Further, the upper transistor TRU may include an upper gate structure 24U and an upper spacer 25U. The upper spacer 25U may separate the upper gate structure 24U from the upper source/drain regions 26U such that the upper gate structure 24U may be electrically isolated from the upper source/drain regions 26U.

In some embodiments, the lower channel regions 22L and the upper channel regions 22U may be nanosheets stacked in the vertical direction, and each of the lower transistor TRL and the upper transistor TRU may be a Multi-Bridge Channel Field Effect Transistor (MBCFET). The nanosheets may include semiconductor material(s) (e.g., silicon, germanium, silicon-germanium, and/or III-V semiconductor compound). For example, each of nanosheets may have a thickness in a range of, for example, from 1 nm to 100 nm in the vertical direction.

The lower source/drain regions 26L and the upper source/drain regions 26U may include semiconductor material(s) (e.g., silicon, germanium, silicon-germanium) and may also include optionally dopants. The lower source/drain regions 26L and the upper source/drain regions 26U may be formed by an epitaxial growth process using the lower channel regions 22L and upper channel regions 22U as a seed layer. The lower spacer 25L and the upper spacer 25U may include an insulating material (e.g., silicon oxide, silicon nitride, and/or silicon oxynitride).

The integrated circuit device 1000 may also include a conductive contact 34 contacting a side surface of the upper source/drain region 26U. The conductive contact 34 may electrically connect the upper source/drain region 26U of the upper transistor TRU to element(s) formed during the back-end-of-line (BEOL) (e.g., a metal line) processes. The conductive contact 34 may include, for example, a metal (e.g., W, Al or Cu), a metal alloy (e.g., Cu—Al alloy), a metal silicide, and/or doped polysilicon. Although, FIG. 4 illustrates the conductive contact 34 as a single layer, the conductive contact 34 may include multiple layers including, for example, a diffusion barrier layer (e.g., a metal nitride) and a metal layer. In some embodiments, the diffusion barrier layer may define an outer surface of the conductive contact 34, and the metal layer may be formed in the diffusion barrier layer. The integrated circuit device 1000 may further include a second insulating layer 44 between the lower transistor TRL and an upper transistor TRU. The first insulating layer 42 and the second insulating layer 44 may include various insulating material(s) (e.g., silicon oxide, silicon nitride, and/or an insulating material having a dielectric constant lower that a dielectric constant of silicon dioxide).

The conductive contact 34 may overlap the lower source/drain region 26L in the vertical direction. In some embodiments, an entirety of the conductive contact 34 may overlap the lower source/drain region 26L in the vertical direction as illustrated in FIG. 3, and thus the conductive contact 34 may be formed without increasing the area of the integrated circuit device 1000. The lower source/drain region 26L may have a first width W1 in a second horizontal direction (e.g., a Y direction). The second horizontal direction may be perpendicular to the first horizontal direction and may be parallel to the upper surface 100U of the substrate 100. In some embodiments, the conductive contact 34 may have a second width W2 in the second horizontal direction, and the first width W1 may be equal to or wider than the second width W2.

Still referring to FIG. 3, the lower source/drain region 26L may include a center portion 26CP in the second horizontal direction. The center portion 26CP of the lower source/drain region 26L may be a portion of the lower source/drain region 26L including a center thereof in the second horizontal direction and having a width of, for example, about 1% of the first width W1. In some embodiments, a center 34c of the conductive contact 34 in the second horizontal direction may overlap the center portion 26CP of the lower source/drain regions 26L in the vertical direction as illustrated in FIG. 3. In some embodiments, the center 34c of the conductive contact 34 in the second horizontal direction may be equidistant from opposing side surfaces of the lower source/drain region 26L, which are spaced apart from each other in the second horizontal direction. The center 34c of the conductive contact 34 may be spaced apart from each of the opposing side surfaces of the lower source/drain region 26L in the second horizontal direction by a first distance D1.

In some embodiments, the lower source/drain region 26L may have a third width W3 in the first horizontal direction, and the upper source/drain region 26U may have a fourth width W4 in the first horizontal direction. The third width W3 may be wider than the fourth width W4. In some embodiments, the fourth width W4 may be determined to allow the entire conductive contact 34 to overlap the lower source/drain region 26L. As used herein, a width of an element (e.g., the upper source/drain region 26U) that has a non-uniform width may refer to a width of its widest portion.

Still referring to FIG. 4, in some embodiments, the conductive contact 34 may extend through the second insulating layer 44 and may contact the center portion 26CP of the lower source/drain region 26L. The upper source/drain region 26U may include a side surface that contacts the conductive contact 34, and the side surface of the upper source/drain region 26U may not be straight. The upper source/drain region 26U may include a protrusion 26P protruding into the conductive contact 34, and the side surface of the upper source/drain region 26U may include a recess. In some embodiments, the protrusion 26P of the upper source/drain region 26U may taper toward the conductive contact 34 as illustrated in FIG. 4. The side surface of the upper source/drain region 26U may include a recess 26R, and a portion of the conductive contact 34 may be in the recess 26R. In some embodiments, the conductive contact 34 may completely fill the recess 26R as illustrated in FIG. 4.

Figure 5:
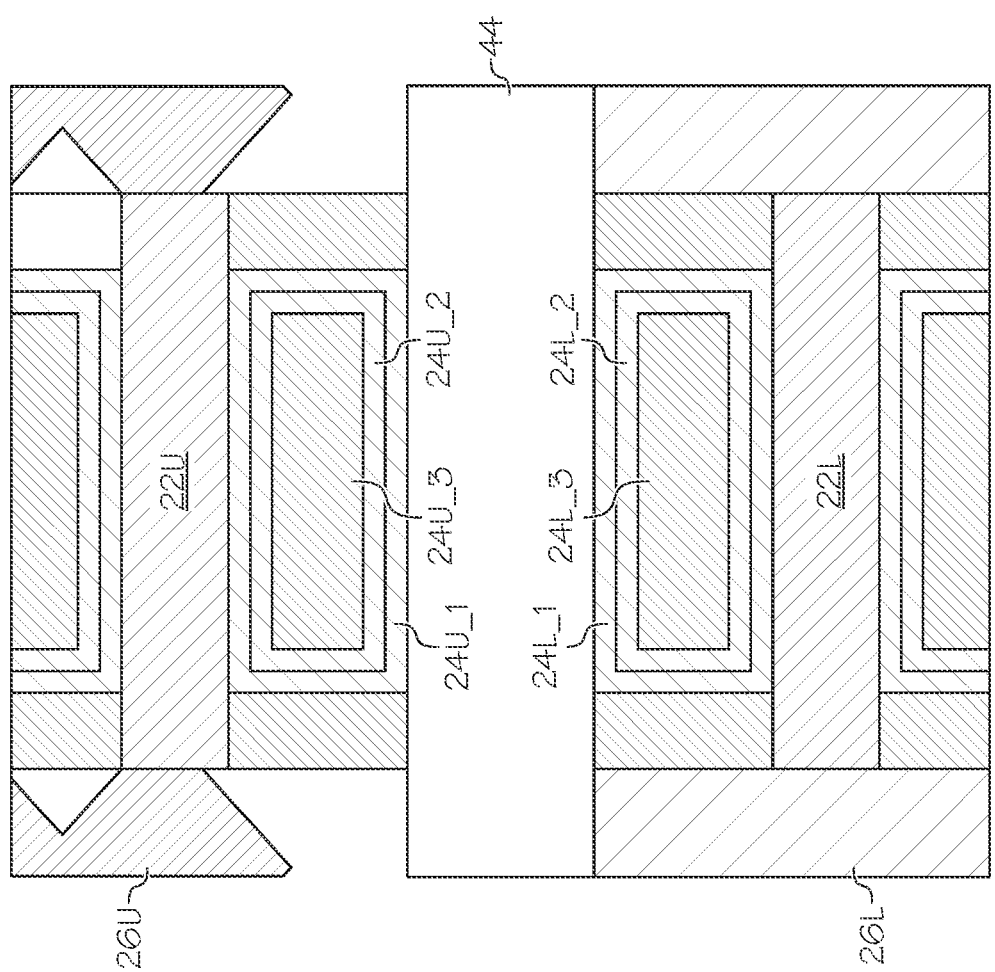
FIG. 5 is a cross-sectional view of the region R in FIG. 4.

FIG. 5 is a cross-sectional view of the region R in FIG. 4. Referring to FIG. 5, each of the lower gate structure 24L and the upper gate structure 24U may include a gate insulator 24L_1 or 24U_1, a work function layer 24L_2 or 24U_2, and a metal layer 24L_3 or 24U_3. The gate insulator 24L_1 or 24U_1 may include, for example, an oxide layer (e.g., silicon oxide layer) and/or an insulating layer having a dielectric constant higher that a dielectric constant of silicon dioxide (e.g., hafnium oxide, tantalum oxide, zirconium oxide). The work function layer 24L_2 or 24U_2 may include, for example, titanium nitride, titanium oxynitride, tantalum nitride, tantalum oxynitride, tungsten nitride, tungsten carbonitride, aluminum oxide. The metal layer 24L_3 or 24U_3 may include, for example, metal (e.g., titanium, aluminum), metal alloy, and/or nitride or carbide of the metal. Sizes and materials of the gate insulator 24L_1 or 24U_1, the work function layer 24L_2 or 24U_2, and the metal layer 24L_3 or 24U_3 may be changed considering the conductive type of the lower gate structure 24L and the upper gate structure 24U. The work function layer 24L_2 or 24U_2 and the metal layer 24L_3 or 24U_3 may be collectively referred to as a gate electrode.

As discussed with reference to FIG. 2A, the lower gate structure 24L and the upper gate structure 24U may be connected to each other, and the gate electrodes of the lower transistor TRL and the upper transistor TRU may be electrically connected to each other.

Figure 6:
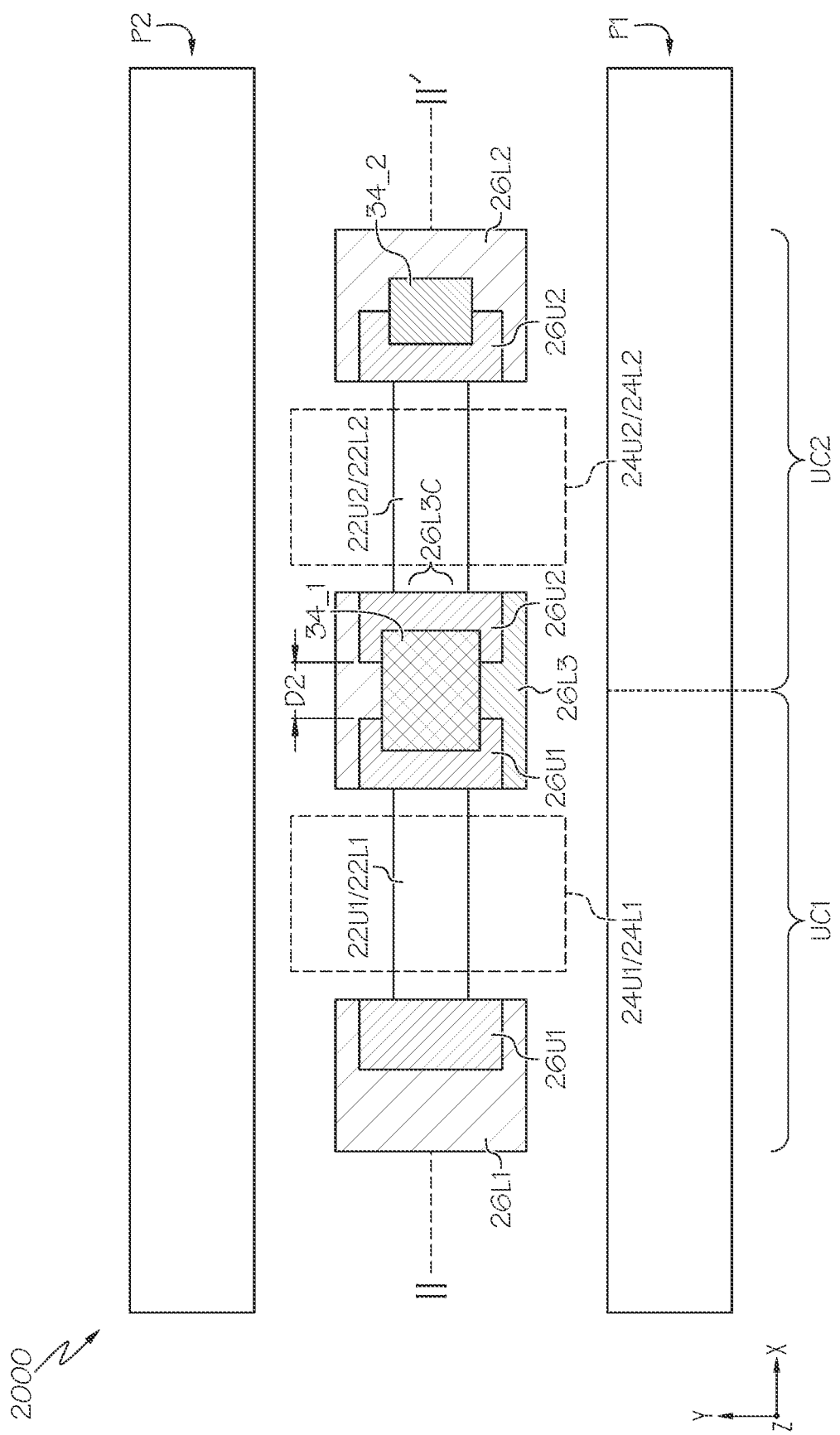
FIG. 6 is a schematic layout of a stacked integrated circuit device according to some embodiments of the present inventive concept.
Figure 7:
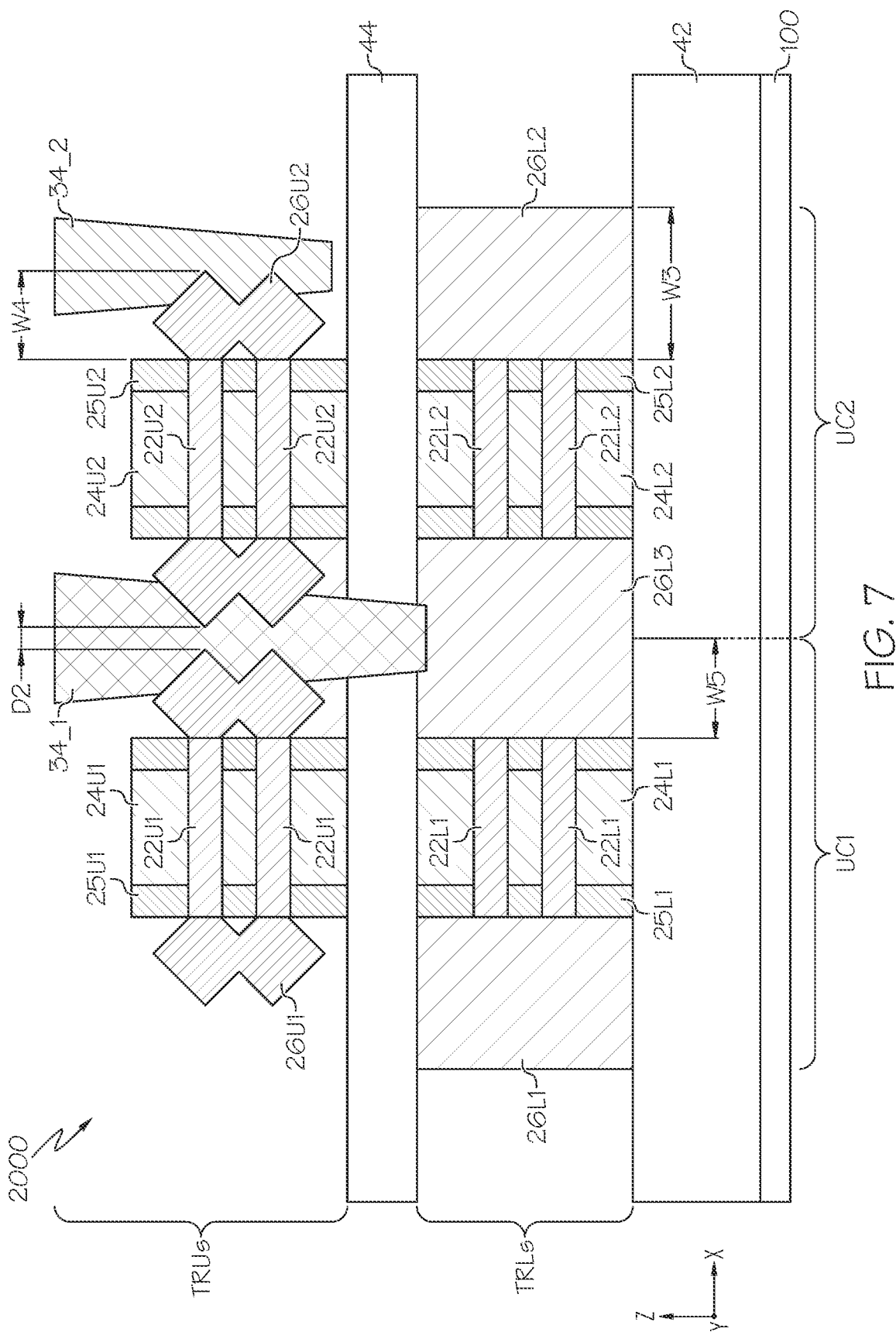
FIG. 7 is a cross-sectional view taken along the line II-IF in FIG. 6.

FIG. 6 is a schematic layout of a stacked integrated circuit device 2000 according to some embodiments of the present inventive concept, and FIG. 7 is a cross-sectional view taken along the line II-IF in FIG. 6. Referring to FIGS. 6 and 7, the stacked integrated circuit device 2000 may include two unit circuits (i.e., UC1 and UC2), and each of the unit circuits UC1 and UC2 may include elements similar to those shown in FIGS. 3 and 4 except a common lower source/drain region 26L3, a first conductive contact 34_1, and a second conductive contact 34_2. Elements having reference numerals that include an overlapping portion (e.g., 22U in FIGS. 4 and 22U1 and 22U2 in FIG. 7) may have the same or similar function and/or may include the same or similar material.

The stacked integrated circuit device 2000 may include a first unit circuit UC1 including a first lower transistor and a first upper transistor. The first lower transistor may include first lower channel regions 22L1, a first lower source/drain region 26L1, a first lower gate structure 24L1, and a first lower spacer 25L1. The first upper transistor may include first upper channel regions 22U1, first upper source/drain regions 26U1, a first upper gate structure 24U1, and a first upper spacer 25U1. The stacked integrated circuit device 2000 may also include a second unit circuit UC2 including a second lower transistor and a second upper transistor. The second lower transistor may include second lower channel regions 22L2, a second lower source/drain region 26L2, a second lower gate structure 24L2, and a second lower spacer 25L2, and the second upper transistor may include second upper channel regions 22U2, second upper source/drain regions 26U2, a second upper gate structure 24U2, and a second upper spacer 25U2.

The first upper channel regions 22U1 may overlap the first lower channel regions 22L1 in the vertical direction, and the second upper channel regions 22U2 may overlap the second lower channel regions 22L2 in the vertical direction. The first upper source/drain region 26U1 may overlap the first lower source/drain region 26L1 in the vertical direction, and the second upper source/drain region 26U2 may overlap the second lower source/drain region 26L2 in the vertical direction.

The stacked integrated circuit device 2000 may include a common lower source/drain region 26L3 that contacts the first lower channel regions 22L1 and the second lower channel regions 22L2. Each of the first and second unit circuits UC1 and UC2 may include a portion of the common lower source/drain region 26L3, and each of the portions of the common lower source/drain region 26L3 may have a fifth width W5 in the first horizontal direction. In some embodiments, the fifth width W5 may be wider than the fourth width W4 of one of the first upper source/drain regions 26U1 and the second upper source/drain regions 26U2. Both the first upper source/drain region 26U1 and the second upper source/drain region 26U2 may overlap the common lower source/drain region 26L3 in the vertical direction.

In some embodiments, the first upper source/drain region 26U1 and the second upper source/drain region 26U2 may be spaced apart from each other in the first horizontal direction by a second distance D2. The stacked integrated circuit device 2000 may also include a first conductive contact 34_1 that may electrically connect the first upper source/drain region 26U1 and the second upper source/drain region 26U2 to elements formed during BEOL processes. The first conductive contact 34_1 may be formed between the first upper source/drain region 26U1 and the second upper source/drain region 26U2. In some embodiments, an entirety of the first conductive contact 34_1 may overlap the common lower source/drain region 26L3 in the vertical direction as illustrated in FIG. 6. The common lower source/drain region 26L3 may include a center portion 26L3C in the second horizontal direction, and the first conductive contact 34_1 may vertically overlap the center portion 26L3C of the common lower source/drain region 26L3 as illustrated in FIG. 6. The center portion 26L3C of the common lower source/drain region 26L3 may be a portion of the common lower source/drain region 26L3 that includes a center thereof in the second horizontal direction and has a width of, for example, about 1% of a width of the common lower source/drain region 26L3 in the second horizontal direction.

Still referring to FIG. 7, each of the first upper source/drain region 26U1 and the second upper source/drain region 26U2 may include a protrusion (e.g., a first protrusion 26P1 and the second 26P2 in FIG. 8) protruding into the first conductive contact 34_1. In some embodiments, the protrusions of the first upper source/drain region 26U1 and the second upper source/drain region 26U2 may taper toward the first conductive contact 34_1. Each of the first upper source/drain region 26U1 and the second upper source/drain region 26U2 may also include a recess (e.g., a first recess 26R1 and a second recess 26R2 in FIG. 8). Portions of the first conductive contact 34_1 may be in (e.g., may completely fill) the recesses of the first upper source/drain region 26U1 and the second upper source/drain region 26U2. In some embodiments, the first conductive contact 34_1 may extend through the second insulating layer 44 and may contact the common lower source/drain region 26L3 as illustrated in FIG. 7. In some embodiments, the first conductive contact 34_1 may be spaced apart from the common lower source/drain region 26L3 in the vertical direction and may not be electrically connected to the common lower source/drain region 26L3.

The stacked integrated circuit device 2000 may additionally include a second conducive contact 34_2 that electrically connects the second upper source/drain region 26U2 to element(s) (e.g., elements formed during BEOL processes). The second conducive contact 34_2 may be same as or similar to the conductive contact 34 illustrated in FIGS. 3 and 4, except that the second conducive contact 34_2 is spaced apart from the second lower source/drain region 26L2 in the vertical direction. The first conductive contact 34_1 and the second conductive contact 34_2 may include the same materials or different materials.

Figure 8:
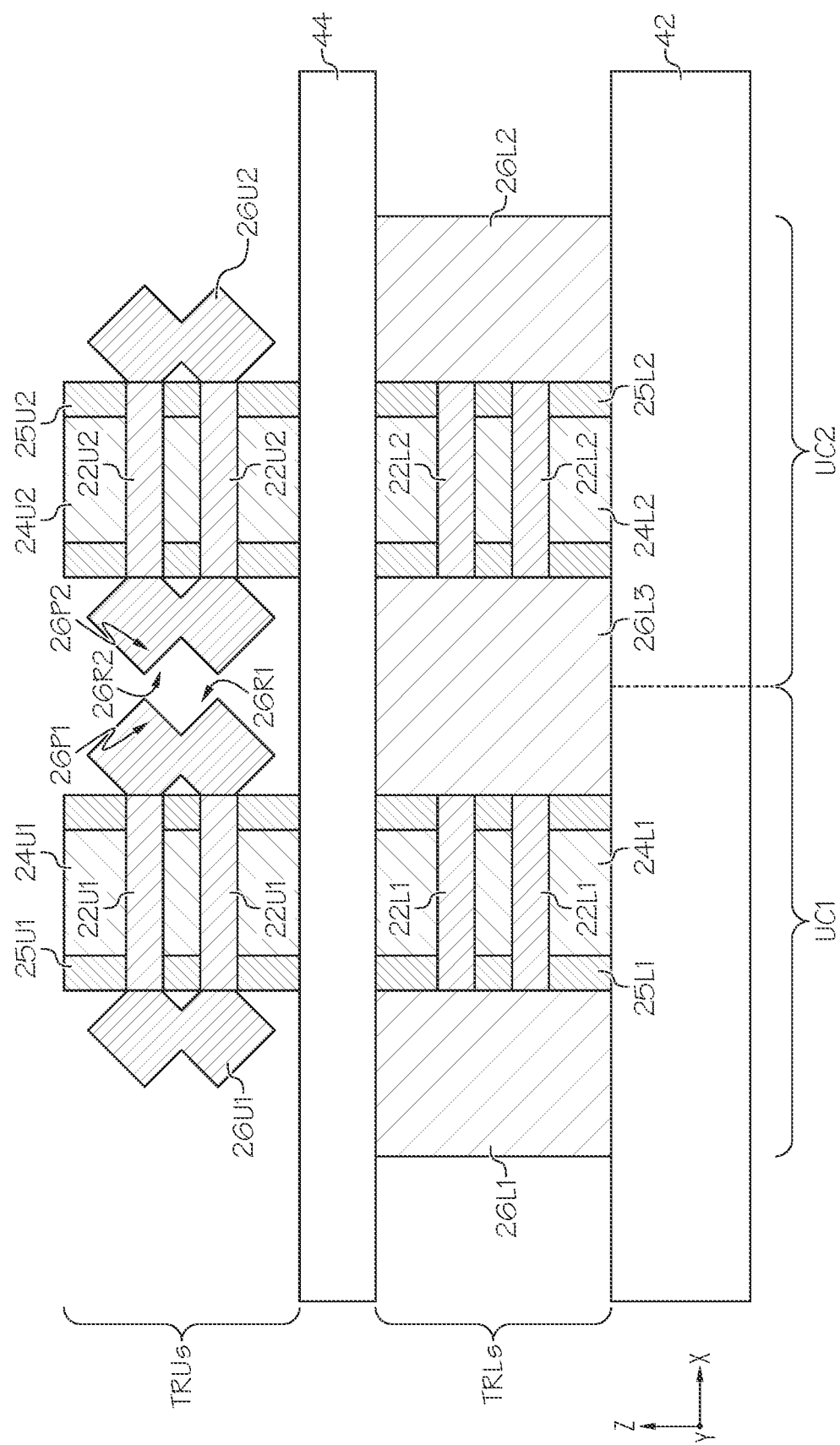
FIGS. 8, 9 and 10 are cross-sectional views, taken along the line II-IF in FIG. 6, illustrating methods of forming a stacked integrated circuit device.
Figure 9:
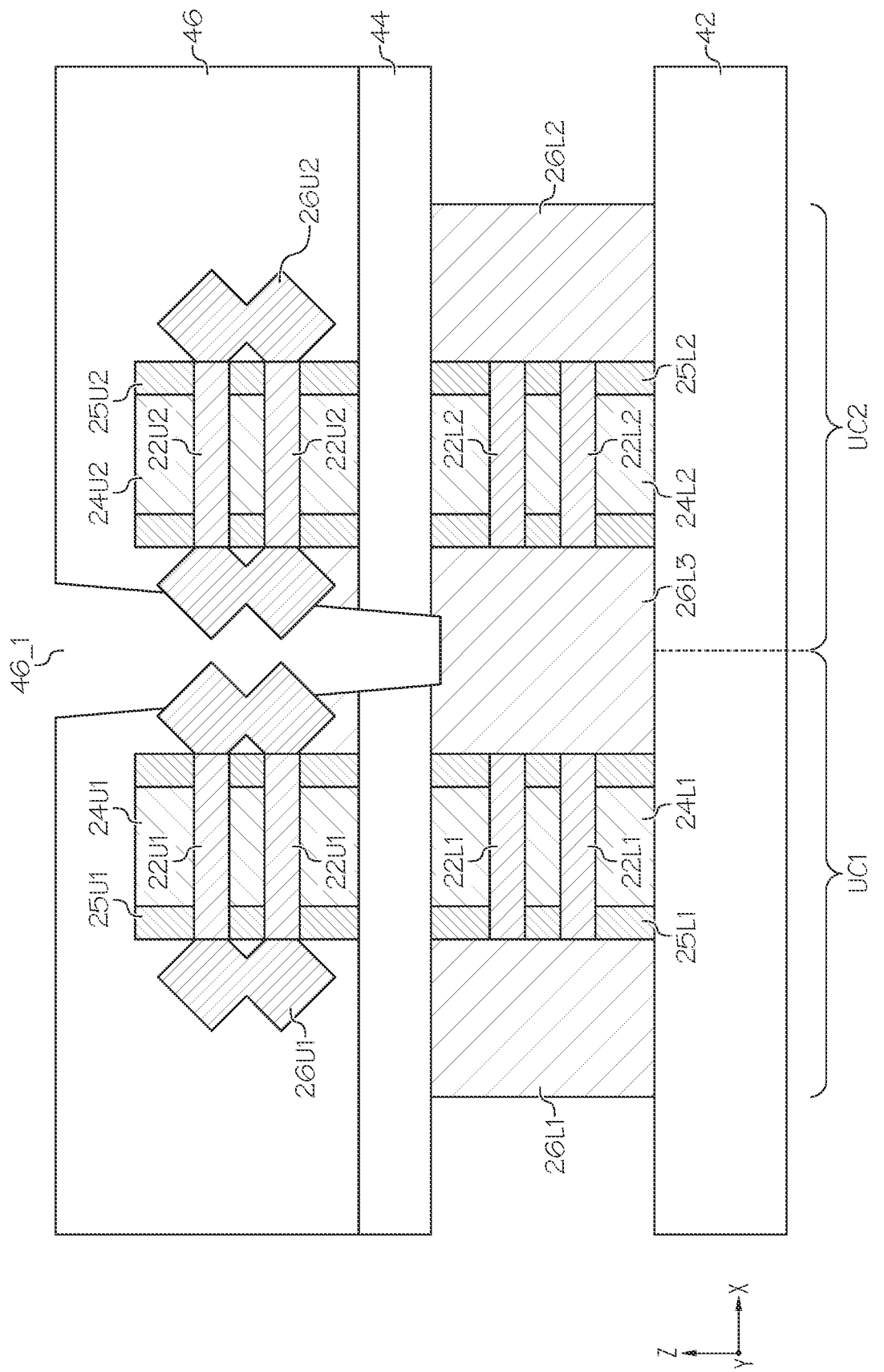
Figure 10:
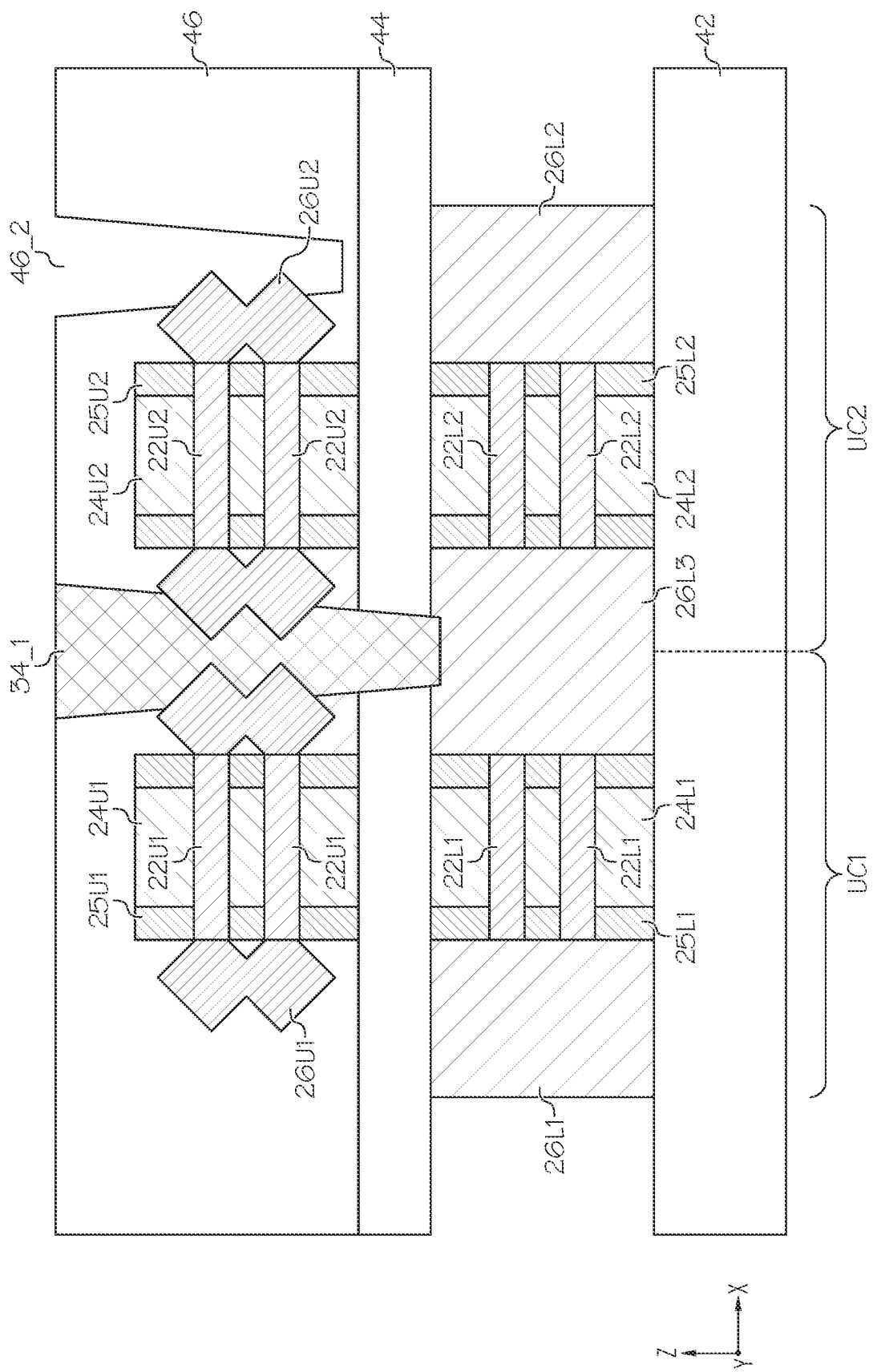

FIGS. 8, 9 and 10 are cross-sectional views, taken along the line II-IF in FIG. 6, illustrating methods of forming the stacked integrated circuit device 2000.

Referring to FIG. 8, lower transistors TRLs and upper transistors TRUs may be formed on a first insulating layer 42. The lower transistors TRLs and upper transistors TRUs may be formed by various processes. For example, each of the first and second lower gate structures 24L1 and 24L2 may be formed by a gate first process or a gate last process (i.e., a replacement gate process), and each of the first and second upper gate structures 24U1 and 24U2 may be formed by a gate first process or a gate last process.

In some embodiments, the first upper source/drain region 26U1 and the second upper source/drain region 26U2 may be formed by an epitaxial growth process respectively using the first upper channel regions 22U1 and the second upper channel regions 22U2 as a seed layer. The first upper source/drain region 26U1 and the second upper source/drain region 26U2 may be grown until a distance therebetween reaches a predetermined distance (e.g., the second distance D2 in FIG. 7) such that the first upper source/drain region 26U1 and the second upper source/drain region 26U2 may be spaced apart from each other. Side surfaces of the first upper source/drain region 26U1 and the second upper source/drain region 26U2 may not be straight and may include recesses 26R1 and 26R2. The recess 26R1 may be recessed toward the first upper channel regions 22U1, and the second recess 26R2 may be recessed toward the second upper channel regions 22U2.

Referring to FIG. 9, a third insulating layer 46 may be formed on the upper transistors TRUs, and then a portion of the third insulating layer 46 may be removed by an etch process to form a first opening 46_1. The insulating layer 46 may include various insulating material(s) (e.g., silicon oxide, silicon nitride, and/or an insulating material having a dielectric constant lower that a dielectric constant of silicon dioxide). The etch process may include an isotropic etch process (e.g., a an isotropic dry etch process and/or a wet etch process) and/or an anisotropic etch process. Etchants and process conditions of the etch process may be determined to selectively etch the third insulating layer 46 while not etching the first upper source/drain region 26U1 and the second upper source/drain region 26U2. As the etch process may selectively remove the portion of the third insulating layer 46, the first upper source/drain region 26U1 and the second upper source/drain region 26U2 exposed to the first opening 46_1 may maintain their shapes during the etch process. In some embodiments, the first opening 46_1 may extend through the second insulating layer 44 and may expose the common lower source/drain region 26L3.

Referring to FIG. 10, a first conductive contact 34_1 may be formed in the first opening 46_1. After the first conductive contact 34_1 is formed, a second opening 46_2 may be formed in the third insulating layer 46. The second opening 46_2 may expose a surface of the second upper source/drain region 26U2, and a bottom of the second opening 46_2 may be defined by the third insulating layer 46. Referring back to FIG. 7, a second conductive contact 34_2 may be formed in the second opening 46_2.

In some embodiments, the second opening 46_2 may be formed before forming the first conductive contact 34_1 in the first opening 46_1, and the first conductive contact 34_1 and the second conductive contact 34_2 may be formed concurrently through the same processes. As used herein "formed concurrently" refers to being formed by same fabrication processes, at approximately (but not necessarily exactly) the same time.

Figure 11:
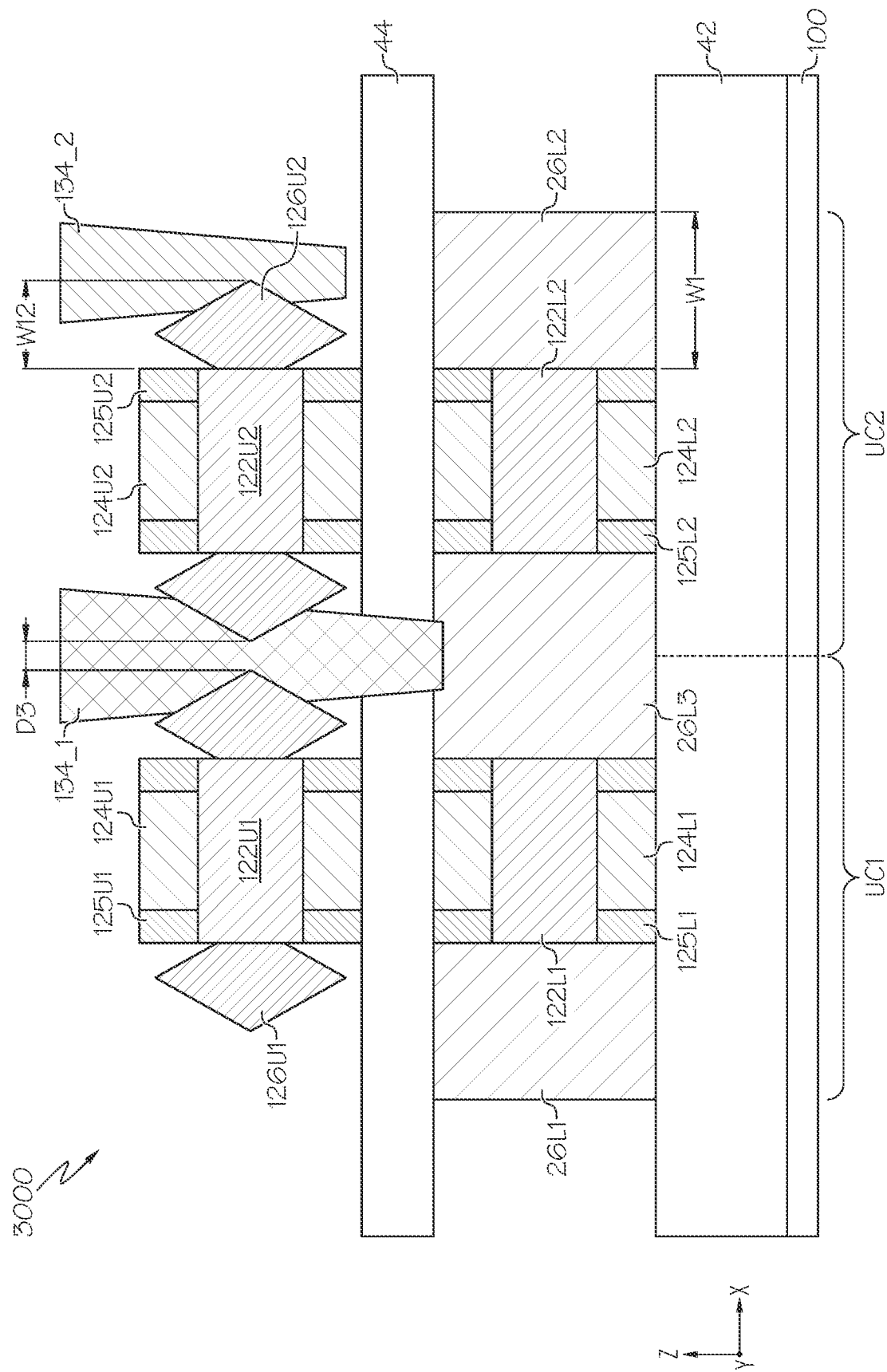
FIG. 11 is a cross-sectional view of a stacked integrated circuit device according to some embodiments of the present inventive concept.

FIG. 11 is a cross-sectional view of a stacked integrated circuit device 3000 according to some embodiments of the present inventive concept. The stacked integrated circuit device 3000 is similar to the stacked integrated circuit device 2000 illustrated in FIGS. 6 and 7 but each of upper and lower channel regions 122L1, 122L2, 122U1, and 122U2 includes a single layer having a fin shape. A schematic layout of the stacked integrated circuit device 3000 may be substantially the same as that illustrated in FIG. 6. Elements including the same reference numeral (e.g., 26U1 in FIGS. 6 and 7 and 126U1 in FIG. 11) may have the same or similar function and/or may include the same or similar material.

Referring to FIG. 11, the stacked integrated circuit device 3000 may include a first unit circuit UC1 and a second unit circuit UC2. The first unit circuit UC1 may include a first lower transistor and a first upper transistor. The first lower transistor may include a first lower channel region 122L1, a first lower source/drain region 26L1, a first lower gate structure 124L1, and a first lower spacer 125L1. The first upper transistor may include a first upper channel region 122U1, first upper source/drain regions 126U1, a first upper gate structure 124U1, and a first upper spacer 125U1. The second lower transistor may include a second lower channel region 122L2, a second lower source/drain region 26L2, a second lower gate structure 124L2, and a second lower spacer 125L2. The second upper transistor may include a second upper channel region 122U2, second upper source/drain regions 126U2, a second upper gate structure 124U2, and a second upper spacer 125U2. Each of the first upper source/drain regions 126U1 and the second upper source/drain region 126U2 may have a width (e.g., W12) in the first horizontal direction, which may be narrower than the first width W1 of each of the first and second lower source/drain regions 26L1 and 26L2 in the first horizontal direction.

The first upper channel region 122U1 may overlap the first lower channel region 122L1 in the vertical direction, and the second upper channel region 122U2 may overlap the second lower channel region 122L2 in the vertical direction. The first upper source/drain region 126U1 may overlap the first lower source/drain region 126L1 in the vertical direction, and the second upper source/drain region 126U2 may overlap the second lower source/drain region 126L2 in the vertical direction. The first upper source/drain region 126U1 and the second lower source/drain region 126L2 may be spaced apart from each other in the first horizontal direction by a third distance D3.

The common lower source/drain region 26L3 may contact the first lower channel region 122L1 and the second lower channel region 122L2. Both the first upper source/drain region 126U1 and the second upper source/drain region 126U2 may overlap the common lower source/drain region 26L3 in the vertical direction. The common lower source/drain region 26L3 may have a width in the first horizontal direction, which is wider than a sum of widths of the first upper source/drain region 126U1 and the second upper source/drain region 126U2 in the first horizontal direction.

Still referring to FIG. 11, the stacked integrated circuit device 3000 may include a first conductive contact 134_1 contacting the first upper source/drain region 126U1 and the second upper source/drain region 126U2. The first conductive contact 134_1 may have non-straight side surfaces as the first upper source/drain region 126U1 and the second upper source/drain region 126U2 protrude into the first conductive contact 134_1. In some embodiments, portions of the first upper source/drain region 126U1 and the second upper source/drain region 126U2 protruding into the first conductive contact 134_1 may taper toward the first conductive contact 134_1 as illustrated in FIG. 11. The stacked integrated circuit device 3000 may include a second conductive contact 134_2 contacting the second upper source/drain region 126U2.

Example embodiments are described herein with reference to the accompanying drawings. Many different forms and embodiments are possible without deviating from the scope of the present inventive concept. Accordingly, the present inventive concept should not be construed as limited to the example embodiments set forth herein. Rather, these example embodiments are provided so that this disclosure will be thorough and complete and will convey the scope of the present inventive concept to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof.

It will be understood that although the terms first, second, etc. may be used herein to describe various elements, these elements should not be limited by these terms. These terms are only used to distinguish one element from another. Thus, a first element could be termed a second element without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
   an upper transistor on a substrate, the upper transistor comprising an upper active region and first and second upper source/drain regions that are spaced apart from each other in a first horizontal direction, wherein each of the first and second upper source/drain regions comprises a first side surface contacting a respective one of opposing side surfaces of the upper active region and a second side surface spaced apart from the first side surface in the first horizontal direction, and the first horizontal direction is parallel to an upper surface of the substrate;
   a lower transistor between the substrate and the upper transistor, the lower transistor comprising a lower active region and first and second lower source/drain regions that are spaced apart from each other in the first horizontal direction and contact opposing side surfaces of the lower active region, respectively, wherein the first upper source/drain region overlaps the first lower source/drain region in a vertical direction that is perpendicular to the upper surface of the substrate, and the first lower source/drain region comprises a center portion in a second horizontal direction that is perpendicular to the first horizontal direction and is parallel to the upper surface of the substrate; and a conductive contact that contacts and overlaps the second side surface of the first upper source/drain region and overlaps the center portion of the first lower source/drain region in the vertical direction.

2. The integrated circuit device of claim 1, wherein the first lower source/drain region comprises opposing side surfaces that are spaced apart from each other in the second horizontal direction, and a center of the conductive contact in the second horizontal direction is equidistant from the opposing side surfaces of the first lower source/drain region.

3. The integrated circuit device of claim 1, wherein an entirety of the conductive contact overlaps the first lower source/drain region in the vertical direction.

4. The integrated circuit device of claim 1, wherein the first lower source/drain region has a first width in the second horizontal direction, the conductive contact has a second width in the second horizontal direction, and the first width is wider than the second width.

5. The integrated circuit device of claim 1, wherein the first upper source/drain region comprises a protrusion that protrudes in the first horizontal direction into the conductive contact.

6. The integrated circuit device of claim 5, wherein the protrusion tapers toward the conductive contact.

7. The integrated circuit device of claim 1, wherein the second side surface of the first upper source/drain region comprises a recess that is recessed toward the first upper source/drain region, and a portion of the conductive contact is in the recess.

8. The integrated circuit device of claim 1, wherein the conductive contact contacts the center portion of the first lower source/drain region.

9. The integrated circuit device of claim 1, wherein the upper active region comprises a plurality of nanosheet layers that are stacked in the vertical direction.

10. The integrated circuit device of claim 1, wherein the upper transistor further comprises an upper gate electrode, and the lower transistor further comprises a lower gate electrode that is electrically connected to the upper gate electrode.

11. An integrated circuit device comprising:
a first upper transistor and a second upper transistor on a substrate, wherein the first and second upper transistors are spaced apart from each other in a first horizontal direction that is parallel to an upper surface of the substrate, each of the first and second upper transistors comprises an upper active region and an upper source/drain region that comprises a first surface contacting the upper active region and a second surface opposite the first surface, and the second surfaces of the upper source/drain regions are spaced apart from each other in the first horizontal direction;
a first lower transistor and a second lower transistor between the substrate and the first and second upper transistors, each of the first and second lower transistors comprising a lower active region and a lower source/drain region contacting the lower active region; and
a conductive contact that contacts the second surfaces of the upper source/drain regions, wherein each of the upper source/drain regions comprises a protrusion that protrudes into the conductive contact.

12. The integrated circuit device of claim 11, wherein the protrusions taper toward the conductive contact.

13. The integrated circuit device of claim 11, wherein each of the second surfaces of the upper source/drain regions comprises a recess, and portions of the conductive contact are in the recesses.

14. A method of forming an integrated circuit device, the method comprising:
forming a first lower transistor and a second lower transistor on a substrate, each of the first and second lower transistors comprising a lower active region and a lower source/drain region contacting the lower active region;
forming a first upper transistor and a second upper transistor on the first and second lower transistors, wherein the first and second upper transistors are spaced apart from each other in a first horizontal direction that is parallel to an upper surface of the substrate, each of the first and second upper transistors comprises an upper active region and an upper source/drain region that comprises a first surface contacting the upper active region and a second surface opposite the first surface, and the second surfaces of the upper source/drain regions are spaced apart from each other in the first horizontal direction;
forming an insulating layer on the first and second upper transistors, the insulating layer separating the second surfaces of the upper source/drain regions from each other;
forming an opening in the insulating layer, the opening exposing the second surfaces of the upper source/drain regions; and
forming a conductive contact in the opening.

15. The method of claim 14, wherein forming the opening comprises removing a portion of the insulating layer while maintaining shapes of the second surfaces of the upper source/drain regions.

16. The method of claim 14, wherein each of the lower source/drain regions is a portion of a common lower source/drain region, and
the common lower source/drain region has a first width in the first horizontal direction, each of the upper source/drain regions has a second width in the first horizontal direction, and the second width is narrower than half of the first width.

17. The method of claim 14, wherein each of the lower source/drain regions is a portion of a common lower source/drain region,
the opening of the insulating layer exposes an upper portion of the common lower source/drain region, and
the conductive contact contacts the upper portion of the common lower source/drain region.

18. The method of claim 14, wherein the upper source/drain regions are formed by an epitaxial growth process using the upper active regions as a seed layer, and each of the second surfaces of the upper source/drain regions comprises a recess.

19. The method of claim 18, wherein forming the conductive contact in the opening comprises forming the conductive contact in the recesses of the second surfaces of the upper source/drain regions.

* * * * *